US010475554B2

(12) United States Patent
Marchisio et al.

(10) Patent No.: US 10,475,554 B2
(45) Date of Patent: Nov. 12, 2019

(54) COAXIAL CABLE AND METHOD OF CONSTRUCTION THEREOF

(71) Applicants: Federal-Mogul Powertrain, LLC, Southfield, MI (US); Acome Societe Cooperative Et Participative Societe Anonyme Cooperative De Production A Capital, Paris (FR)

(72) Inventors: Jean-Michel Marchisio, Trosly Breuil (FR); Benoit Laurent, Trosly Breuil (FR)

(73) Assignee: Federal-Mogul Powertrain LLC, Southfield, MI (US)

( * ) Notice: Subject to any disclaimer, the term of this patent is extended or adjusted under 35 U.S.C. 154(b) by 0 days.

(21) Appl. No.: 15/823,102

(22) Filed: Nov. 27, 2017

(65) Prior Publication Data

US 2018/0082768 A1 Mar. 22, 2018

Related U.S. Application Data

(62) Division of application No. 14/102,180, filed on Dec. 10, 2013, now abandoned.

(Continued)

(51) Int. Cl.
*H01B 11/18* (2006.01)
*H01B 5/00* (2006.01)
(Continued)

(52) U.S. Cl.
CPC ..... *H01B 11/1895* (2013.01); *H01B 11/1813* (2013.01); *H01B 11/1878* (2013.01); *H01B 13/016* (2013.01); *Y10T 29/49123* (2015.01)

(58) Field of Classification Search
CPC .... D02G 3/441; D03D 1/0041; D03D 1/0058; D03D 15/0027; D03D 15/02; H01B 5/00;
(Continued)

(56) References Cited

U.S. PATENT DOCUMENTS 5,262,592 A * 11/1993 Aldissi ................. H01B 11/146 174/106 SC
5,475,185 A * 12/1995 Tokarsky ........... H01B 11/1813 174/107
(Continued)

FOREIGN PATENT DOCUMENTS

CN 101461013 A 6/2009
CN 102483975 A 5/2012
(Continued)

OTHER PUBLICATIONS

He Bing et al., Quick to Learn the Telephone and Television System, China Electric Power Press, Jun. 2009, pp. 64-70.

*Primary Examiner* — Timothy J Thompson
*Assistant Examiner* — Guillermo J Egoavil
(74) *Attorney, Agent, or Firm* — Robert L. Stearns; Dickinson Wright, PLLC

(57) ABSTRACT

A coaxial cable and method of construction thereof are provided. The coaxial cable includes an elongate central conductive member; a dielectric insulative layer encasing the central conductive member; an outer protective sheath, and a braided EMI shield layer including hybrid yarn sandwiched between the dielectric insulative layer and the outer protective sheath. The hybrid yarn includes an elongate nonconductive filament and an elongate continuous conductive wire filament. The wire filament is interlaced in electrical communication with itself or other wire filaments along a length of the EMI shield layer to provide protection to the central conductive member against at least one of EMI, RFI or ESD. The method includes providing a central conductive member; forming a dielectric insulative layer surrounding the central conductive member; braiding an EMI shield layer including hybrid yarn about the insulative layer, and forming an outer protective sheath about the braided EMI shield layer.

4 Claims, 6 Drawing Sheets

Related U.S. Application Data

(60) Provisional application No. 61/736,977, filed on Dec. 13, 2012.

(51) Int. Cl.

| | |
|---|---|
| ***H01B 7/00*** | (2006.01) |
| ***H05K 9/00*** | (2006.01) |
| ***H01B 13/016*** | (2006.01) |

(58) Field of Classification Search

CPC . H01B 7/00; H01B 7/04; H01B 11/18; H01B 11/1813; H01B 11/1878; H01B 11/1895; H01B 13/016; H02G 3/0406; H02G 3/0481; H05K 9/00; Y10T 29/49123

USPC ...................... 174/106 R, 350, 113 R, 36, 34

See application file for complete search history.

(56) References Cited

U.S. PATENT DOCUMENTS

| | | | | |
|---|---|---|---|---|
| 2007/0275199 | A1 | 11/2007 | Chen | |
| 2010/0084179 | A1* | 4/2010 | Harris | D02G 3/441 174/350 |

FOREIGN PATENT DOCUMENTS

| | | | | |
|---|---|---|---|---|
| JP | S39029197 | Y | 10/1964 | |
| JP | H04029118 | U | 3/1992 | |
| JP | 2013258304 | A * | 12/2013 | H05K 9/00 |
| WO | 2011028460 | A2 | 3/2011 | |

* cited by examiner

FIG. 1
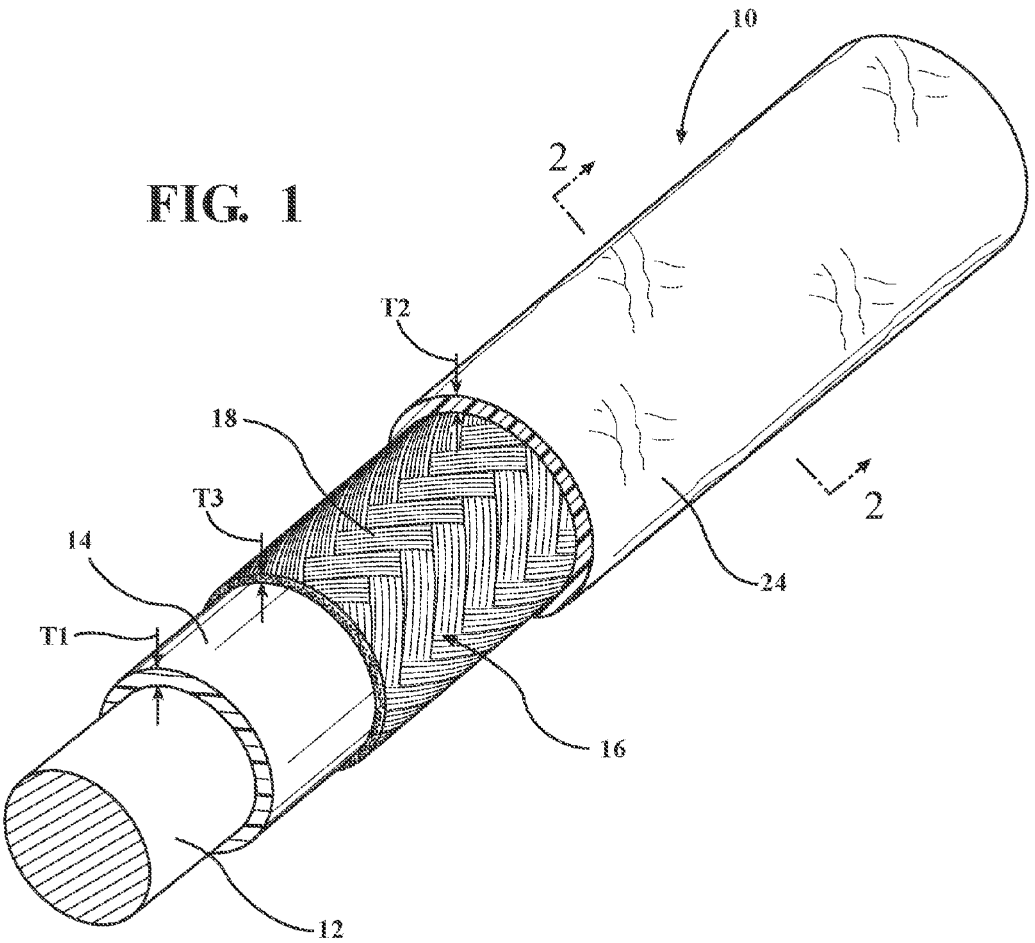
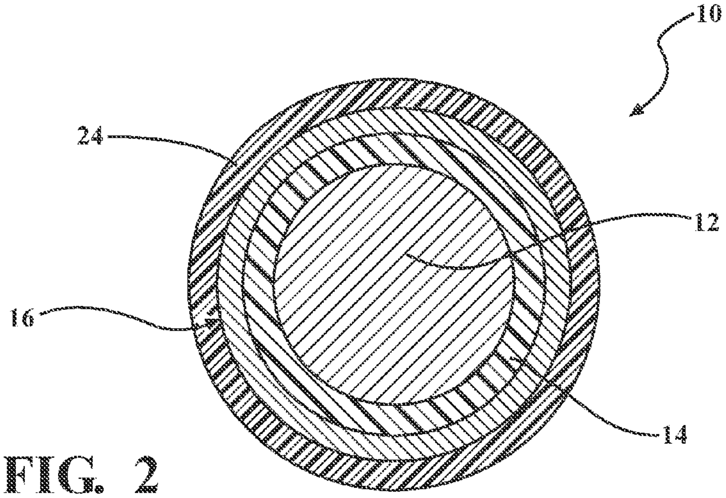
FIG. 2

COAXIAL CABLE AND METHOD OF CONSTRUCTION THEREOF

CROSS-REFERENCE TO RELATED APPLICATION

This divisional application claims priority to U.S. application Ser. No. 14/102,180, filed Dec. 10, 2013, which claims the benefit of U.S. Provisional Application Ser. No. 61/736,977, filed Dec. 13, 2012, both of which are incorporated herein by reference in their entirety.

BACKGROUND OF THE INVENTION

1. Technical Field

This invention relates generally to sleeves for protecting elongate electrical members and more particularly to coaxial cables having an electromagnetic interference shield layer sandwiched between an inner insulative layer and an outer sheath.

2. Related Art

It is known that electromagnetic interference (EMI), radio frequency interference (RFI), and electrostatic discharge (ESD) can present a potential problem to the proper functioning of electronic components due to signal interference caused by inductive coupling between nearby electrical conductors and propagating electromagnetic waves. Electronic systems generate electromagnetic energy as a result of current flow through a circuit. This electromagnetic energy can adversely affect the performance of surrounding electronic components, whether they are in direct communication within the circuit or located nearby. For example, electrical currents in conductors associated with an electrical power system in an automobile may induce spurious interference signals in various electronic components, such as an electronic module. Such interference could downgrade the performance of the electronic module or other components in the vehicle, thereby causing the vehicle to function other than desired. Similarly, inductive coupling, such as between electrical wiring in relatively close relation to lines carrying data in a computer network or other communication system, may have a corrupting effect on the data being transmitted over the network.

The adverse effects of EMI, RFI and ESD can be effectively eliminated by imparting proper shielding and via grounding of EMT, RFI and ESD sensitive components. For example, wires carrying control signals which may be subjected to unwanted interference from internally or externally generated EMI, RFI and ESD may be shielded by using a specialized protective sleeve capable of shielding interference. One well known type of wire typically provided with specialized shielding is referred to as a "coaxial cable." The name "coaxial cable" comes from the fact that various layers of the cable extend coaxially with one another, wherein the various layers typically include an innermost central conductor; a non-conductive (dielectric) insulative layer surrounding the central conductor; an EMI shield layer consisting solely of braided wire surrounding the insulative layer; and an outermost protective sheath. While coaxial cables are generally effective at forming a reliable electrical circuit and eliminating electrical interference, the known cables have inherent drawbacks.

The EMI shield layer of known coaxial cables is typically constructed entirely of braided bare copper, tinned copper, aluminium alloys or tinned aluminium alloys wire. Although this provides an effective barrier against EMI, it is expensive given the high content of the tin or copper metal wire. In addition, with the EMI shield layer being constructed solely from metal, the stiffness is relatively high, and thus, the ability to route the coaxial cable over a meandering path and/or about a corner is jeopardized. Further yet, with the EMI shield layer being made entirely of metal, it is aggressive in its ability to mechanically abrade the inner insulative layer and the relatively thick outermost protective sheath. Accordingly, the stiffness and mass of the coaxial cable is increased, thereby further diminishing the flexibility of the cable and requiring an increased amount of space to route the cable due to its relative stiffness. The need for an increased amount of space can be very costly and prohibitive where space is at a premium, and further, the increased stiffness can result in damage to the cable if the cable is bent beyond its flex capacity. In addition to the aforementioned drawbacks, a further drawback results from having a pure metal EMI layer, namely, the inability of the pure metal EMI layer to dampen shock, which ultimately can result in damage to the functionality of the cable. Yet a further drawback results from having a pure metal EMI layer, namely, a reduced ability of the pure metal EMI layer to elastically return to its originally braided configuration, typically referred to as ability to elastically "spring-back", also referred to as "push-back", upon being bent. As such, a pure metal EMI layer, upon being bent is susceptible to permanent, plastic deformation, which can produce undesirable permanent gaps between adjacent braided metal wires. Gaps of unintended, increased size between adjacent wires can ultimately reduce the EMI shielding effectiveness of the EMI layer, and thus, the functionality of the coaxial cable can be diminished.

A coaxial cable manufactured in accordance with the invention overcomes or greatly minimizes at least those limitations of the prior art described above, and in particular reduces the overall mass and increases the flexibility, though it is believed that those possessing ordinary skill in the art will recognized additional benefits upon viewing the inventive disclosure that follows.

SUMMARY OF THE INVENTION

One aspect of the invention provides a coaxial cable including an elongate central conductive member; a dielectric insulative layer surrounding the central conductive member; an outer protective sheath, and a braided EMI shield layer including hybrid yarn sandwiched between the dielectric insulative layer and the outer protective sheath in abutment with the dielectric insulative layer and the outer protective sheath. The hybrid yarn includes an elongate nonconductive filament and an elongate continuous conductive wire filament. The wire filament is interlaced in electrical communication with itself or other wire filaments along a length of the EMI shield layer to provide protection to the central conductive member against at least one of EMI, RFI or ESD.

In accordance with another aspect of the invention, the relative thickness of the outer protective layer is reduced, thereby facilitating a reduction in overall mass and an increase in flexibility of the coaxial cable.

In accordance with another aspect of the invention, the elastic push-back property of the EMI shield layer is enhanced to avoid the formation of permanent gaps between the braided hybrid yarns due to the content of the nonconductive filament in the hybrid yarn of the EMI shield layer.

In accordance with another aspect of the invention, the diameter of the coaxial cable is minimized as a result of the hybrid yarn containing EMI shield layer allowing the outer protective sheath to be reduced in relative thickness without sacrificing the functionality of the individual layers.

In accordance with another aspect of the invention, the impact resistance of the coaxial cable is increased by the presence of the relatively soft, nonconductive filament of the hybrid yarn.

Another aspect of the invention provides a method of constructing a coaxial cable. The method includes providing a central conductive member; forming a dielectric insulative layer surrounding the central conductive member; braiding an EMI shield layer, including hybrid yarn, about the insulative layer, and forming an outer protective sheath about the braided EMI shield layer. The hybrid yarn is provided having an elongate nonconductive filament and an elongate continuous conductive wire filament. The wire filament is braided in electrical communication with itself or other wire filaments along a length of the EMI shield layer to provide a barrier to the central conductive member against at least one of EMI, RFI or ESD.

In accordance with another aspect of the invention, the method includes reducing the relative thickness of the outer protective layer, thereby facilitating a reduction in the overall mass and an increase in the flexibility of the coaxial cable.

In accordance with another aspect of the invention, the method includes increasing the elastic push-back property of the EMI shield layer via the presence of the nonconductive filament of the hybrid yarn to avoid the formation of plastically deformed, permanent gaps between adjacent conductive wire filaments of the braided hybrid yarns.

In accordance with another aspect of the invention, the method includes minimizing the diameter of the coaxial cable without sacrificing the durability and functionality of the individual layers.

In accordance with another aspect of the invention, the mass of the coaxial cable is reduced relative to the state of the art.

In accordance with another aspect of the invention, the method includes increasing the impact resistance of the coaxial cable via the presence of the nonconductive filaments of the hybrid yarn.

Accordingly, coaxial cables produced in accordance with the invention provide at least the following benefits over known coaxial cables, among others which will be recognized by those skilled in the art: they have a minimized outer diameter as a result of being able to minimize the thickness of the outer protective sheath; they have a reduced mass and a reduced relative weight; they have an increased flexibility, and thus can be routed within a minimized amount of space; they exhibit an increased push-back, and thereby maintain their full shielding effectiveness as manufactured; they are cost efficient in manufacture and in use, and have an increased durability, and thereby exhibit a long and useful life.

BRIEF DESCRIPTION OF THE DRAWINGS

These and other features and advantages will become readily apparent to those skilled in the art in view of the following detailed description of presently preferred embodiments and best mode, appended claims, and accompanying drawings, in which:

FIG. 1 is a perspective view of a coaxial cable constructed according to one presently preferred embodiment of the invention;

FIG. 2 is an enlarged cross-sectional view taken generally along the line of 2-2 of FIG. 1;

DETAILED DESCRIPTION OF PREFERRED EMBODIMENTS

Figure 1A:
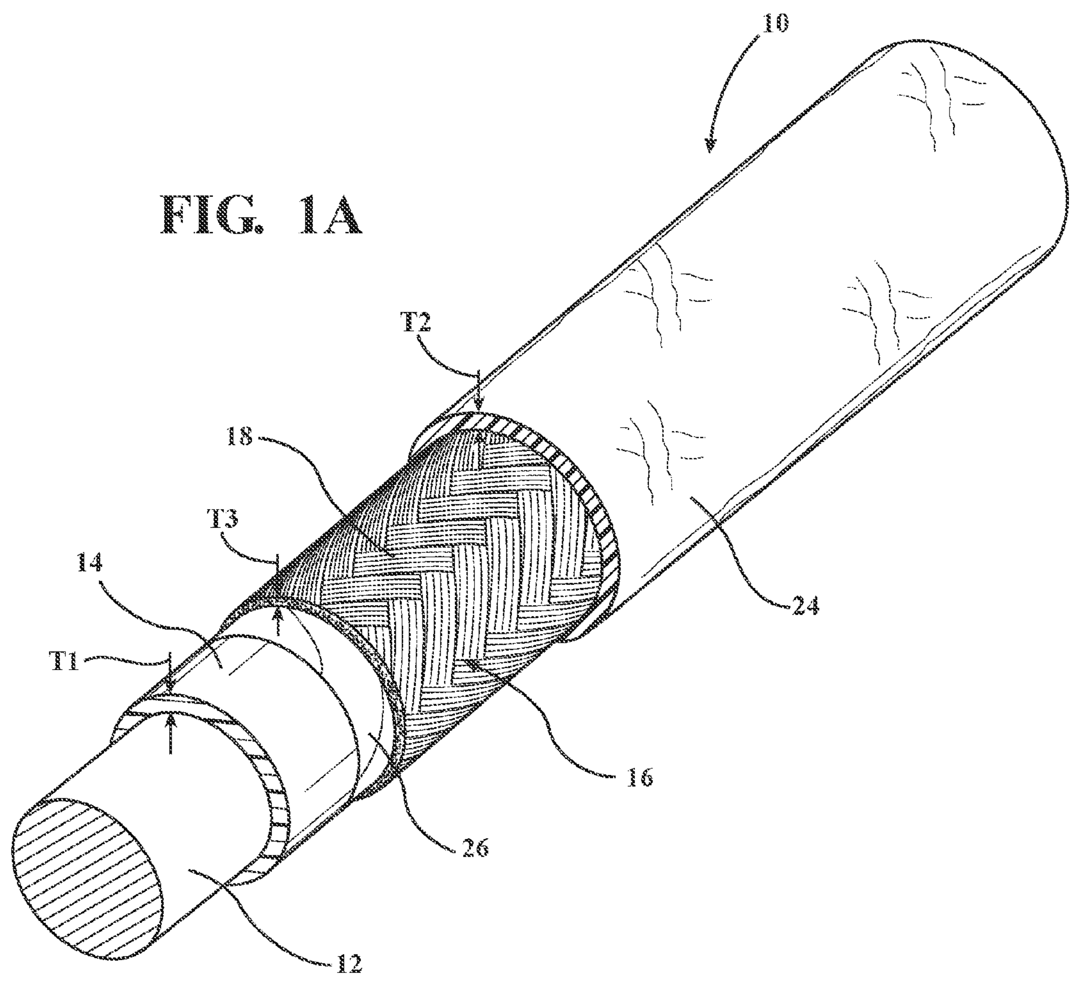
FIG. 1A is a view similar to FIG. 1 of a cable constructed according to another presently preferred embodiment of the invention.
Figure 1B:
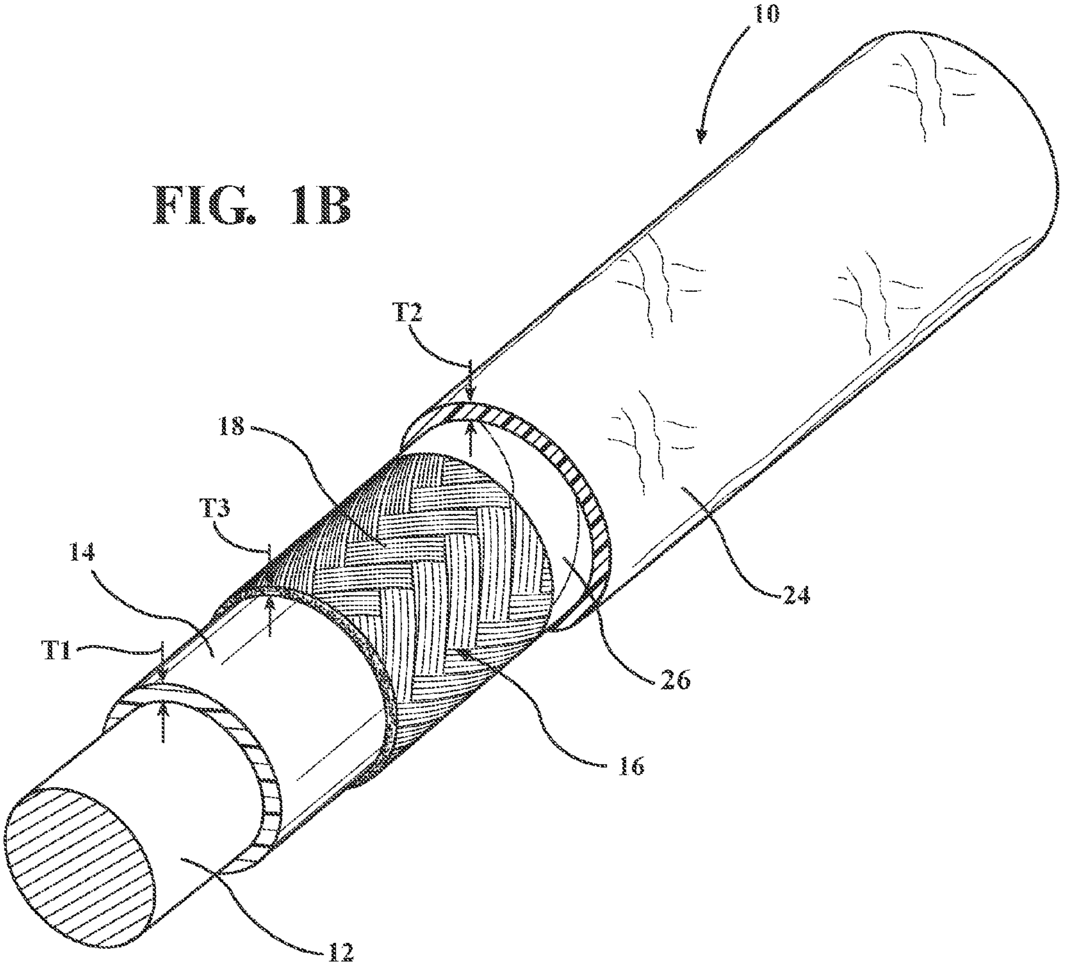
FIG. 1B is a view similar to FIG. 1A of a cable constructed according to yet another presently preferred embodiment of the invention.

Referring in more detail to the drawings, FIG. 1 shows a coaxial cable, referred to hereafter as cable 10, constructed in accordance with one aspect of the invention. The cable 10 includes a central conductive member 12, which can be provided as one or a plurality of electrically conductive wires, and a nonconductive insulative layer 14 having a thickness t1 surrounding the central conductive member 12. Further, an EMI protective shield layer having a thickness t3, referred to hereafter as shield layer 16, is braided about the insulative layer 14. The shield layer 16 is braided at least in part with hybrid yarn 18 (FIGS. 3-12) formed of at least one or a plurality of nonconductive monofilaments or members and/or at least one or a plurality of nonconductive multifilaments or members, referred to hereafter simply as nonconductive members 20, unless otherwise specified, twisted and/or served with at least one or a plurality of continuous strands of micron-sized conductive wire filaments, referred to hereafter simply as wire filaments 22. Further yet, an outer protective layer, also referred to as sheath 24, having a thickness t2 is formed about the shield layer 16. The shield layer 16, being constructed at least in part from the hybrid yarn 18, results in synergies that allow the thickness t2 of the outer protective sheath 24 to be reduced, thereby enhancing the flexibility of the cable 10 and reducing its mass relative to a known coaxial cable, such as those discussed in the background, wherein the mass of the cable 10 has been found, in one example, to be reduced by about 13.4% on a 45 $mm^2$ cable 10 relative to a known 45 $mm^2$ coaxial cable. In addition to the aforementioned layers 14, 16, 24, an additional intermediate shielding layer of foil 26, such as aluminum foil, by way of example, can be disposed between the insulative layer 14 and the shield layer 16 (FIG. 1A) or between the hybrid layer 16 and the sheath 24 (FIG. 1B). The additional foil layer 26 facilitates effective shielding of high frequencies, such as between about 300 MHz to about 1 GHz. In construction, the foil layer 26 is preferably spiral wrapped about the adjacent inner layer. Further, the nonconductive member or members 20 of the hybrid yarn 18 enhances the elastic springy push-back of the shield layer 16 upon being pushed, bent and straightened, thereby ensuring the hybrid yarns 18 of the braided shield layer 16 retain their close "as braided configuration", thereby ensuring optimal protection against at least one or more of electromagnetic interference (EMI), radio frequency interference (RFI), and/or electrostatic discharge (ESD) is provided and reliably maintained during installation and use. In addition, the relative softness of the nonconductive member or members 20, as compared with metal wire, of the hybrid yarn 18 increases the ability of the cable 10 to withstand impact forces without resulting in damage to the cable 10, and ultimately extends the useful life of the cable 10.

The individual, continuous wire filament or filaments 22 of the shield layer 16 are about 20-100 μm in diameter, by way of example and without limitation. Upon braiding the hybrid yarn 18 about the dielectric insulative layer 14 and the central conductive member 12, the central conductive member 12 receives optimal protection from unwanted interference, such as inductive coupling interference or self-induced internal reflective interference, thereby providing any electrical components connected to or otherwise receiving an electrical signal from the central conductive member 12 with the desired, unattenuated operating signal.

The nonconductive members 20, in one presently preferred embodiment, are provided as multi-filamentary yarns, also referred to as multifilaments, which provides the shield layer 16 with a soft texture and impact dampening property. Depending on the application, the nonconductive members 20, whether multifilaments or monofilaments, as discussed in more detail hereafter, can be formed from, by way of example and without limitation, polyester, nylon, polypropylene, polyethylene, acrylic, cotton, rayon, and fire retardant (FR) versions of all the aforementioned materials when extremely high temperature ratings are not required. If higher temperature ratings are desired along with FR capabilities, then the nonconductive members 20 could be constructed from, by way of example and without limitation, materials including m-Aramid (sold under names Nomex, Conex, Kermel, for example), p-Aramid (sold under names Kevlar, Twaron, Technora, for example), PEI (sold under name Ultem, for example), PPS, LCP, TPFE, and PEEK. When even higher temperature ratings are desired along with FR capabilities, the nonconductive members 20 can include mineral yarns such as fiberglass, basalt, silica and ceramic, for example. Regardless, the nonconductive yarn 20 is comparatively soft relative to the wire filaments 22, and thus, provides the shield layer 16 with a non-aggressive, non-abrasive inner and outer surface, which ultimately reduces the potential for abrasion to the insulative layer 14 and to the outer protective sheath 24. Accordingly, the thickness t2 of the outer protective sheath 24 can be reduced relative to that of prior art coaxial cable without fear of abrading through the wall of the outer protective sheath 24. Accordingly, with the increased flexibility of the shield layer 16, due to the presence of the relatively flexible nonconductive yarn 20, and the reduced thickness of the outer protective sheath 24, the overall flexibility of the cable 10 is increased and total mass of the cable 10 is reduced relative to prior art coaxial cables. Further, given the soft, compliant texture of the nonconductive members 20, the ability of the cable 10 to withstand impact forces is increased relative to prior art coaxial cables, thereby further lessening the likelihood of damage to the cable 10.

Figure 3:
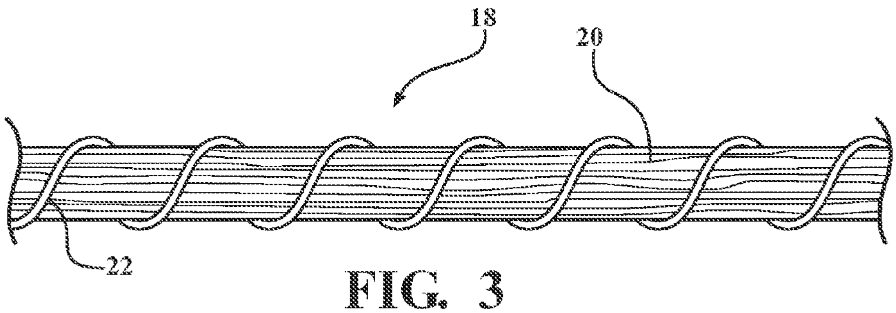
FIG. 3 is an enlarged side view of a hybrid yarn that can be used in the construction of an EMI shield layer of the coaxial cable of FIG. 1.
Figure 4:
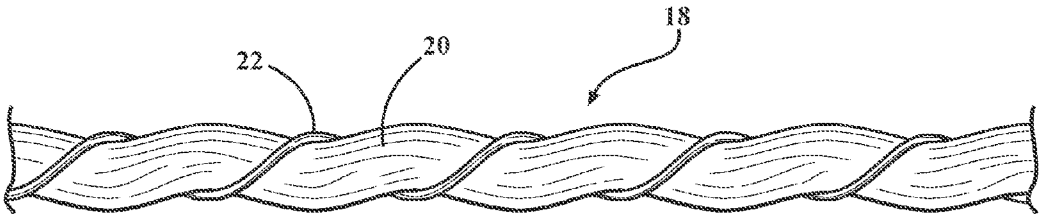
FIG. 4 is an enlarged side view of another hybrid yarn that can be used in the construction of an EMI shield layer of the coaxial cable of FIG. 1.

As mentioned, the continuous conductive wire filaments 22 can be either served with the nonconductive member 20, such as shown in FIG. 3, for example, such that the nonconductive member 20 extends along a generally straight path, while the conductive wire filament 22 extends along a helical path about the nonconductive member 20, or twisted with the nonconductive members 20, such as shown in FIG. 4, for example, such that the nonconductive member 20 and wire filament 22 both extend over helical paths about one another. Regardless of how constructed, it is preferred that at least a portion of the conductive wire filaments 22 remain or extend radially outward of an outer surface of the nonconductive members 20. This facilitates maintaining effective EMI, RFI and/or ESD shielding properties of the cable 10 constructed at least in part from the hybrid yarn 18 by ensuring the wire filament 22 comes into conductive contact with an adjacent overlying wire filament 22. The conductive wire filaments 22 are preferably provided as continuous strands of stainless steel, such as a low carbon stainless steel, for example, SS316L, which has high corrosion resistance properties, however, other conductive continuous strands of metal wire could be used, such as, copper, tin or nickel plated copper, aluminum, and other conductive alloys, such as copper-clad aluminum or tin-plated copper, for example.

Figure 5:
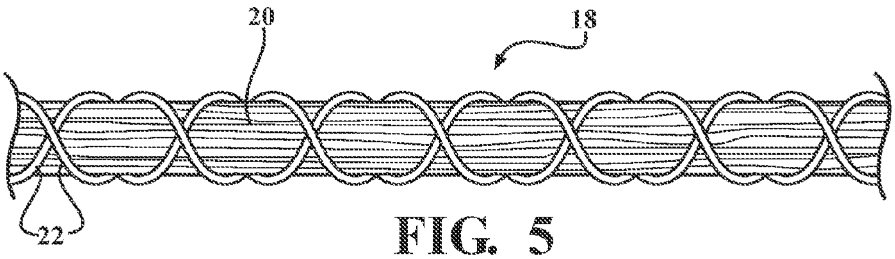
FIG. 5 is an enlarged side view of yet another hybrid yarn that can be used in the construction of an EMI shield layer of the coaxial cable of FIG. 1.
Figure 6:
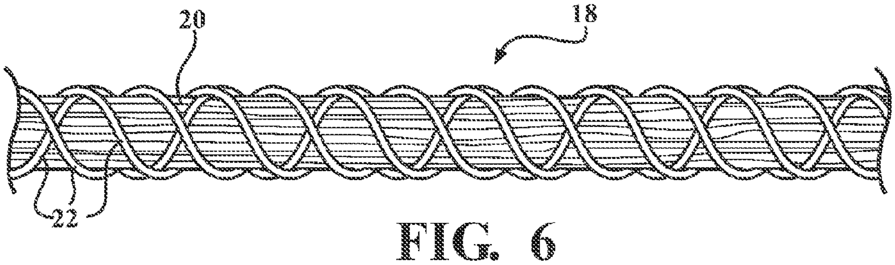
FIG. 6 is an enlarged side view of yet another hybrid yarn that can be used in the construction of an EMI shield layer of the coaxial cable of FIG. 1.

The continuous conductive wire filament or filaments 22 can overlie the nonconductive member or members 20 by being twisted or served about the nonconductive members 20 to form the hybrid yarn 18 having a single strand conductive wire filament 22 (FIGS. 3, 4 and 7), a plurality, shown as two strands of conductive wire filaments 22 (FIGS. 5, 8-11), three strands of conductive wire filaments 22 (FIGS. 6 and 12), or more, as desired, extending along the length of the hybrid yarn 18. It should be recognized that any desired number of conductive wire filaments 22 can be used, depending on the shielding desired, with the idea that an increased number of conductive wires along the length of the hybrid yarn 18 generally increases the shielding potential of the hybrid yarn 18. When two or more conductive wire filaments 22 are used, they can be arranged to overlap one another, such as, by way of example and without limitation, by having different helical angles and/or by twisting or serving the wire filaments 22 in opposite helical directions, as shown in FIGS. 5 and 6, or they can be configured in non-overlapping relation with one another by having similar helical angles and by being twisted or served in the same helical direction, such as shown in FIGS. 8-12, for example.

The arrangement of the wire filaments 16, and their specific construction, whether having single, double, triple, or more conductive wires 22, used in constructing the hybrid yarn 18, is selected to achieve the shielding potential desired.

Figure 7:
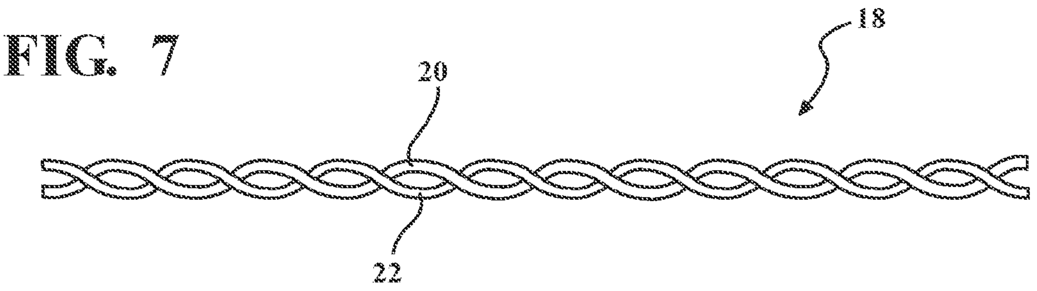
FIG. 7 is an enlarged side view of yet another hybrid yarn that can be used in the construction of an EMI shield layer of the coaxial cable of FIG. 1.

As shown in FIG. 7, in accordance with yet another presently preferred aspect of the invention, a hybrid yarn 18 is constructed by serving, or as shown, twisting a single conductive wire filament 22 with a single nonconductive filament 20, shown here as being a monofilament formed from one of the aforementioned materials.

Figure 8:
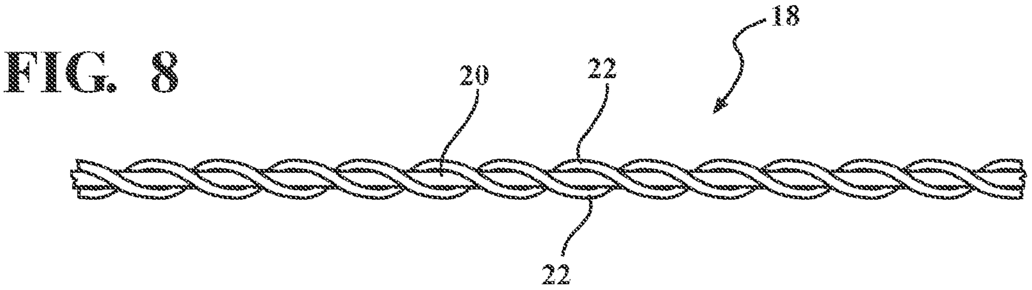
FIG. 8 is an enlarged side view of yet another hybrid yarn that can be used in the construction of an EMI shield layer of the coaxial cable of FIG. 1.

As shown in FIG. 8, in accordance with yet another presently preferred aspect of the invention, a hybrid yarn 18 is constructed by serving two or more conductive wire filaments 22 about a single nonconductive filament, shown here as a nonconductive monofilament 20. As shown, the wire filaments 22 in this embodiment are served in the same direction with one another having substantially the same helix angle, and thus, do not overlap one another.

Figure 9:
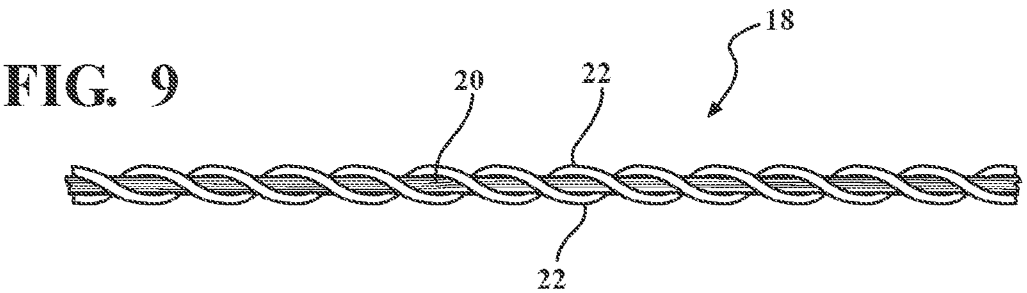
FIG. 9 is an enlarged side view of yet another hybrid yarn that can be used in the construction of an EMI shield layer of the coaxial cable of FIG. 1.

As shown in FIG. 9, in accordance with yet another presently preferred aspect of the invention, a hybrid yarn 18 is constructed by serving two or more conductive wire filaments 22 about a single nonconductive filament 20. However, rather than serving them about a monofilament, as in FIG. 8, the wire filaments 22 are served about a multifilament 20.

Figure 10:
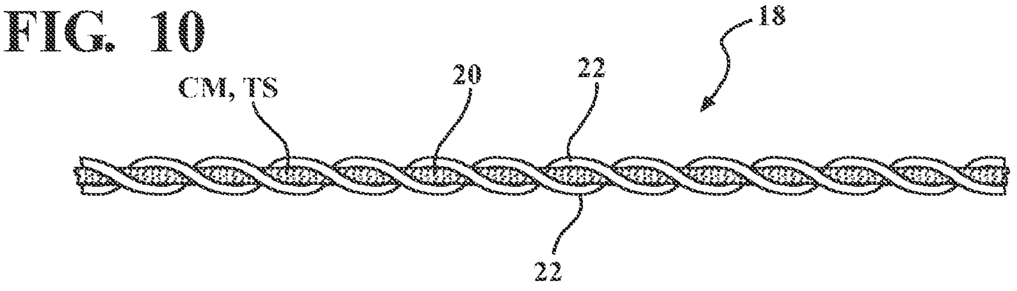
FIG. 10 is an enlarged side view of yet another hybrid yarn that can be used in the construction of an EMI shield layer of the coaxial cable of FIG. 1.

As shown in FIG. 10, in accordance with yet another presently preferred aspect of the invention, a hybrid yarn 18 is constructed generally the same as described above and shown in FIGS. 8 and 9 by serving two or more conductive wire filaments 22 about a single nonconductive filament, shown here as a nonconductive monofilament 20. However, prior to serving the conductive wire filaments 22 about the nonconductive filament 20, the nonconductive monofilament 20 is either treated by first applying and adhering a coating material CM to its outer surface, or the outer surface has a texturized surface TS provided thereon in a texturizing process. The coating material CM or texturized surface TS acts to inhibit the conductive wire filaments 22 from slipping relative to the underlying nonconductive monofilament 20.

Figure 11:
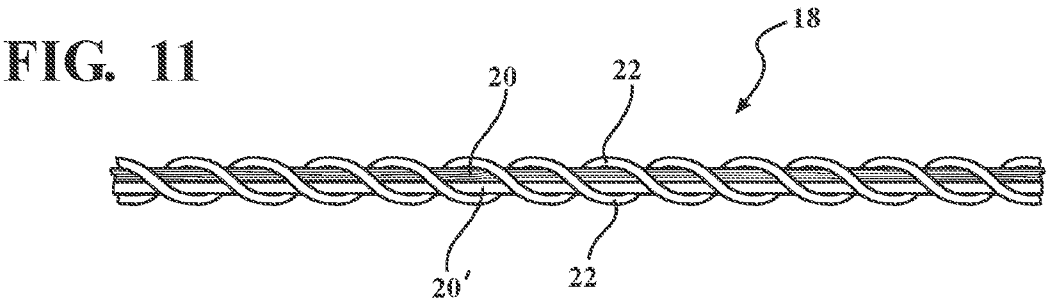
FIG. 11 is an enlarged side view of yet another hybrid yarn that can be used in the construction of an EMI shield layer of the coaxial cable of FIG. 1.
Figure 12:
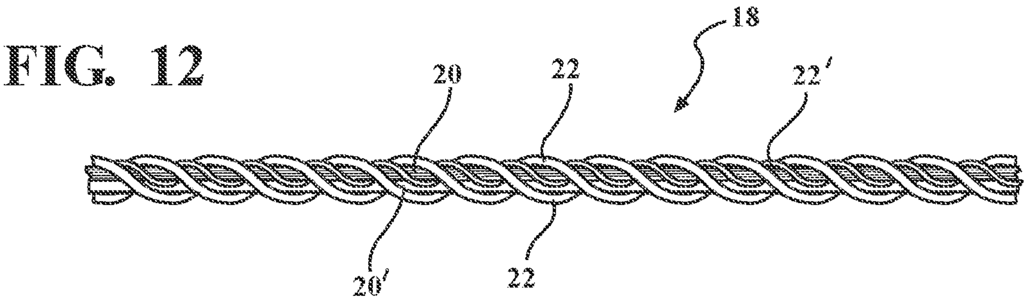
FIG. 12 is an enlarged side view of yet another hybrid yarn that can be used in the construction of an EMI shield layer of the coaxial cable of FIG. 1.

As shown in FIG. 11, in accordance with yet another presently preferred aspect of the invention, a hybrid yarn 18 is constructed by serving two or more conductive wire filaments 22 about a pair of nonconductive filaments 20, 20'. The nonconductive filaments 20, 20' are represented here as being a nonconductive multifilament 20 and a nonconductive monofilament 20', provided from the aforementioned materials. The nonconductive multifilament 20 and monofilament 20' abut one another along their lengths. Further, as shown in FIG. 12, a hybrid yarn 18 constructed in accordance with yet another presently preferred aspect of the invention has at least one of the nonconductive members, shown here as the multifilament nonconductive member 20, provided as a hybrid yarn, such as shown as discussed above with regard to FIG. 3, having another conductive wire filament 22' twisted or served thereabout, though any of the other previously described and illustrated embodiments of the hybrid yarn 18 could be used. Accordingly, at least one of the continuous conductive wire filaments 22' extends or loops solely about the nonconductive multifilament 20, while the other continuous conductive wire filament 22 extends or loops about both nonconductive filaments 20, 20'.

In accordance with another aspect of the invention, a method of constructing a coaxial cable 10 is provided. The method includes providing an electrically conductive member 12 and forming an insulative layer 14 about the electrically conductive member, such as be an extrusion process or otherwise. The method further includes braiding a shield layer 16 about the insulative layer 14 and then forming an outer protective sheath 24 about the shield layer 16. In accordance with the invention, the braiding process further includes braiding the shield layer 16 at least in part from hybrid yarn 18, as described above, including at least one electrically conductive wire filament 22 twisted or served with at least one nonconductive filament 20. It should be recognized that the braided shield layer 16 can be braided entirely from the hybrid yarn 18, or including non-hybrid yarn in combination with the hybrid yarn 18. If the braided shield layer 16 is braided with less than 100% hybrid yarn 18, it should be recognized that any suitable monofilaments or multifilaments, such as those described above, could be used. It should further be recognized that the maximum shielding is achieved by using 100% hybrid yarn 18 to braid the shield layer 16.

In accordance with another aspect of the invention, the method includes enhancing the impact resistance and reducing the thickness of the outer sheath 24 relative to the thickness of an outer sheath of a coaxial cable constructed in accordance with the prior art, thereby increasing the flexibility and reducing the mass of the coaxial cable 10 relative to a coaxial cable constructed in accordance with the prior art.

In accordance with another aspect of the invention, the method can further include wrapping a foil layer 26 about at least one of the insulative layer 14 or the shield layer 16 to further facilitate providing protection against high frequencies, such as between about 300 MHz and 1 GHz.

Obviously, many modifications and variations of the present invention are possible in light of the above teachings. It is, therefore, to be understood that within the scope of the appended claims, the invention may be practiced otherwise than as specifically described.

What is claimed is:

1. A coaxial cable, consisting of:

a central conductive member;

a dielectric insulative layer surrounding said central conductive member;

an outer protective sheath;

a braided EMI shield layer sandwiched between said dielectric insulative layer and said outer protective sheath in abutment with said dielectric insulative layer, said braided EMI shield layer being braided with hybrid yarn, said hybrid yarn including at least one electrically conductive wire filament twisted or served with at least one nonconductive filament; and a layer of foil disposed between said braided EMI shield layer and said outer protective sheath in abutment with said EMI shield layer and said outer protective sheath.

2. The coaxial cable of claim 1 wherein said braided EMI shield layer is braided entirely with said hybrid yarn.

3. The coaxial cable of claim 1 wherein at least one of said at least one nonconductive filament is a multifilament.

4. The coaxial cable of claim 3 wherein at least one of said at least one nonconductive filament is a monofilament.

* * * * *